(12) United States Patent
Amarnath et al.

(10) Patent No.: US 9,754,645 B2
(45) Date of Patent: Sep. 5, 2017

(54) BIT LINE CHARGING FOR A DEVICE

(71) Applicant: SANDISK TECHNOLOGIES LLC, Plano, TX (US)

(72) Inventors: Anirudh Amarnath, San Jose, CA (US); Tai-Yuan Tseng, Milpitas, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/924,498

(22) Filed: Oct. 27, 2015

(65) Prior Publication Data

US 2017/0117024 A1   Apr. 27, 2017

(51) Int. Cl.
G11C 7/00 (2006.01)
G11C 7/12 (2006.01)

(52) U.S. Cl.
CPC ........................................ G11C 7/12 (2013.01)

(58) Field of Classification Search
CPC ....................................................... G11C 7/12
USPC ............................................ 365/189.16, 203
See application file for complete search history.

(56) References Cited

U.S. PATENT DOCUMENTS

| | | | | |
|---|---|---|---|---|
| 6,002,614 A * | 12/1999 | Banks | ................. | G11C 11/5621 365/189.09 |
| 6,125,056 A * | 9/2000 | Chen | ...................... | G11C 16/10 365/185.18 |
| 7,719,902 B2 | 5/2010 | Dong et al. | | |
| 7,924,587 B2 | 4/2011 | Perlmutter et al. | | |
| 2003/0169630 A1* | 9/2003 | Hosono | ................. | G11C 16/10 365/200 |
| 2006/0239092 A1 | 10/2006 | Cheng et al. | | |
| 2007/0285976 A1* | 12/2007 | Happ | ................... | G11C 11/5678 365/163 |
| 2010/0054057 A1 | 3/2010 | Meterelliyoz et al. | | |
| 2010/0080064 A1* | 4/2010 | Di Iorio | ............. | G11C 16/3427 365/185.19 |
| 2011/0249505 A1* | 10/2011 | Park | ................... | G11C 16/0483 365/185.19 |
| 2013/0155763 A1* | 6/2013 | Alam | ..................... | G11C 11/165 365/158 |
| 2014/0226415 A1* | 8/2014 | Toyama | ................. | G11C 16/24 365/185.25 |
| 2015/0146485 A1* | 5/2015 | Kim | ..................... | G11C 11/5628 365/185.03 |

* cited by examiner

Primary Examiner — Viet Q Nguyen
(74) Attorney, Agent, or Firm — Kunzler Law Group, PC

(57) ABSTRACT

An apparatus includes a first bit line coupled to a first storage element and a second bit line coupled to a second storage element. A first bit line charging circuit is coupled to the first bit line and is configured to charge the first bit line to a first bias voltage of multiple bias voltages based on a first programming state. A second bit line charging circuit is coupled to the second bit line and is configured to charge the second bit line to a second bias voltage of the multiple bias voltages based on a second programming state. The second programming state is different than the first programming state.

16 Claims, 4 Drawing Sheets

BIT LINE CHARGING FOR A DEVICE

FIELD OF THE DISCLOSURE

The present disclosure is generally related to devices and more particularly to bit line charging for devices, such as a bit line pre-charge process for a data storage device.

BACKGROUND

Storage devices enable storage and retrieval of data. Examples of storage devices include volatile memory devices and non-volatile memory devices. Data stored at a non-volatile memory device may be retained at the non-volatile memory device during a power-down event.

Storage devices may store one or more bits per storage element. For example, in a one-bit-per-cell storage scheme, a storage element may be programmed to a first state that indicates a logic one bit or a second state that indicates a logic zero bit. As another example, in a two-bits-per-cell storage scheme, a storage element may be programmed to one of four states, where each of the four states indicates a particular bit sequence.

Using a multiple-bits-per-cell storage scheme may enable high data storage density at a storage device and may also utilize circuit area and other resources of the storage device. For example, as a number of bits per cell increases, more circuitry may be used to write data to and sense data from the storage device. As another example, a write operation to write the data to the storage device may use more clock cycles and more power as a number of bits per cell increases.

DETAILED DESCRIPTION

A device may independently charge a plurality of bit lines during a bit line charging process that is performed prior to a write operation to write data to a group of storage elements coupled to the plurality of bit lines. Bit lines of the plurality of bit lines may be charged independently by applying a set of bias voltages that correspond to states indicated by the data, such as by iteratively increasing a bias voltage at each bit line until the bias voltage reaches a "target" state for the bit line.

To further illustrate, in an illustrative two-bits-per-cell implementation, the data may indicate a particular set of states including erase ("Er") states, "A" states, "B" states, and "C" states for the group of storage elements. During a first cycle of the bit line charging process, each of the bit lines may be charged to a first bias voltage associated with "Er" states. Bit lines coupled to storage elements selected for an "Er" state may remain at the first bias voltage while bias voltages of bit lines coupled to storage elements selected for a "A" state, a "B" state, or a "C" state may be increased to a second voltage. The bit line charging process may continue until each bit line of the plurality of bit lines is biased based on a state for a storage element coupled to the bit line.

After performing the bit line charging process, a write operation may be performed to program the set of storage elements. For example, a single programming pulse may be applied to the set of storage elements (e.g., via a word line) using a one-shot programming (OSP) technique. Because the plurality of bit lines are independently biased, the single programming pulse may program the particular set of states indicated by the data to the group of storage elements. For example, a greater difference between a voltage level of the programming pulse and a first bias voltage at a first bit line may program a first state to a first storage element, and a smaller difference between the voltage level of the programming pulse and a second bias voltage at a second bit line may program a second state to a second storage element. Accordingly, the write operation may use a single programming pulse (e.g., instead of multiple programming pulses to sequentially program different states at storage elements), which may simplify certain aspects of device operation.

Particular aspects of the disclosure are described below with reference to the drawings. In the description, common or similar features may be designated by common reference numbers. As used herein, "exemplary" may indicate an example, an implementation, and/or an aspect, and should not be construed as limiting or as indicating a preference or a preferred implementation.

Figure 1:
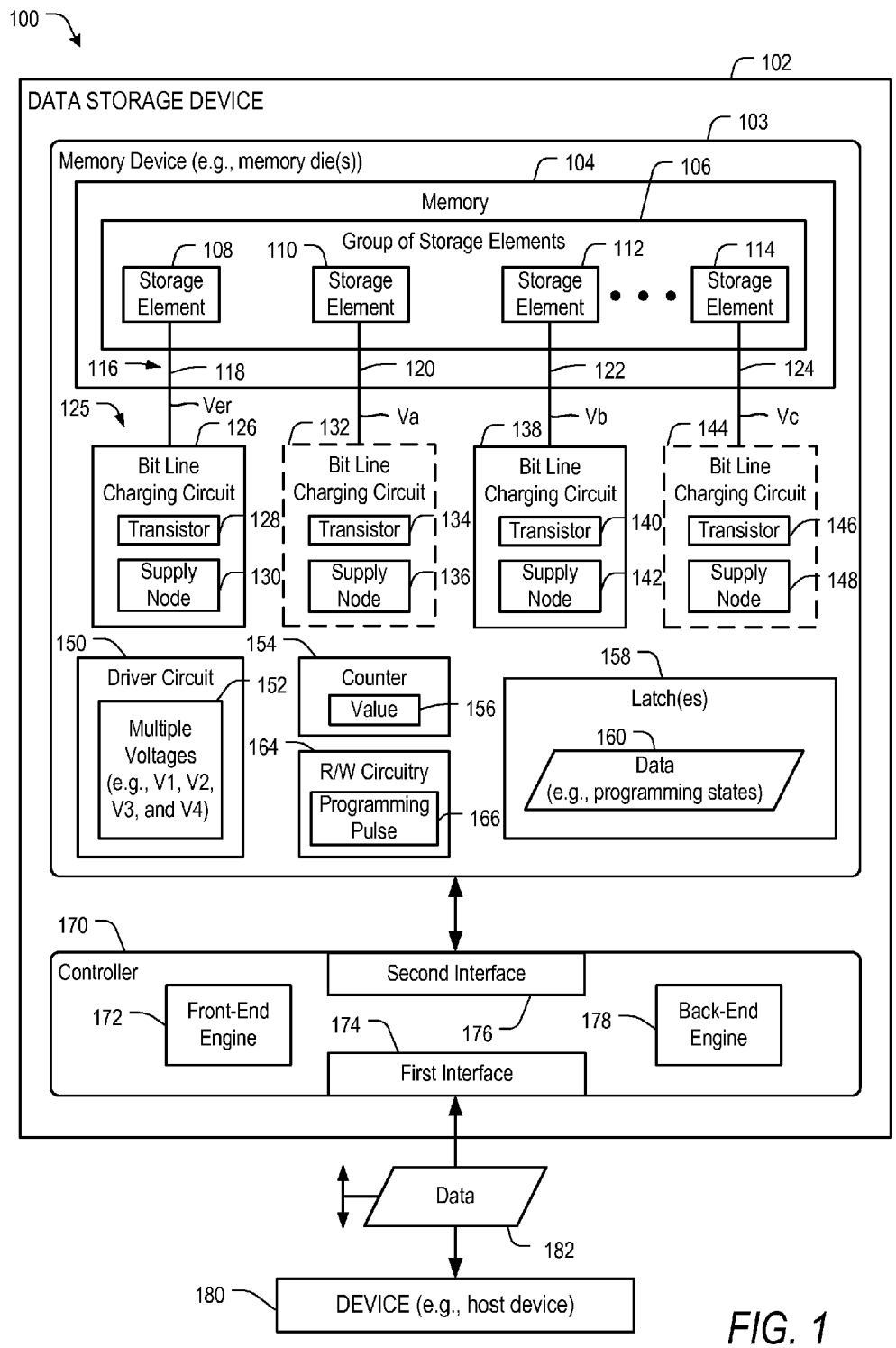
FIG. 1 is a diagram of a particular illustrative example of a system that includes a data storage device having one or more bit line charging circuits configured to apply multiple bias voltages to a set of bit lines.

Referring to FIG. 1, a particular illustrative example of a system is depicted and generally designated 100. The system 100 includes a data storage device 102 and a device 180 (e.g., a host device or an access device).

The data storage device 102 includes a memory device 103. The memory device 103 may include one or more memory dies (e.g., one memory die, two memory dies, sixty-four memory dies, or another number of memory dies).

The memory device 103 includes a memory 104, such as a non-volatile array of storage elements included in a memory die. The memory 104 may include a flash memory (e.g., a NAND flash memory) or a resistive memory, such as a resistive random access memory (ReRAM), as illustrative examples. The memory 104 may have a three-dimensional (3D) memory configuration. As used herein, a 3D memory device may include multiple physical levels of storage elements (instead of having a single physical level of storage elements, as in a planar memory device). As an example, the memory 104 may have a 3D vertical bit line (VBL) configuration. In a particular implementation, the memory 104 is a non-volatile memory having a 3D memory array configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 includes one or more groups of storage elements, such as a group of storage elements 106. An example of a group of storage elements is a memory die. Another example of a group of storage elements is a block, such as a NAND flash erase group of storage elements. Another example of a group of storage elements is a word line of storage elements (e.g., a word line of NAND flash storage elements or a word line of resistance-based storage elements). A group of storage elements may have a singlelevel-cell (SLC) configuration, a multi-level-cell (MLC) configuration, or a tri-level-cell (TLC) configuration, as illustrative examples. Each storage element of the memory 104 may be programmable to a state (e.g., a threshold voltage in a flash configuration or a resistive state in a resistive memory configuration) that indicates one or more values. As an example, in an illustrative TLC scheme, a storage element may be programmable to a state that indicates three values. As an additional example, in an illustrative MLC scheme, a storage element may be programmable to a state that indicates two values. In the example of FIG. 1, the group of storage elements 106 includes a storage element 108, a storage element 110, a storage element 112, and a storage element 114.

The memory device 103 further includes a plurality of bit lines 116 and one or more bit line charging circuits, such as a set of bit line charging circuits 125. The set of bit line charging circuits 125 may include a bit line charging circuit 126, a bit line charging circuit 132, a bit line charging circuit 138, and a bit line charging circuit 144.

The bit line charging circuits 126, 132, 138, and 144 are coupled to the group of storage elements 106 via the plurality of bit lines 116. For example, the plurality of bit lines 116 may include a bit line 118 coupled to the storage element 108 and to the bit line charging circuit 126. As additional examples, the plurality of bit lines 116 may include a bit line 120 coupled to the storage element 110 and to the bit line charging circuit 132, a bit line 122 coupled to the storage element 112 and to the bit line charging circuit 138, and a bit line 124 coupled to the storage element 114 and to the bit line charging circuit 144.

One or more of the bit line charging circuits 126, 132, 138, and 144 may include a transistor and a supply node. For example, the bit line charging circuit 126 may include a transistor 128 and a supply node 130. As additional examples, the bit line charging circuit 132 may include a transistor 134 and a supply node 136, the bit line charging circuit 138 may include a transistor 140 and a supply node 142, and the bit line charging circuit 144 may include a transistor 146 and a supply node 148.

The memory device 103 may also include one or more driver circuits (e.g., a driver circuit 150), a counter 154, one or more latches 158, and read/write circuitry 164. The one or more latches 158 may be coupled to the bit line charging circuits 126, 132, 138, and 144. The driver circuit 150 may be coupled to the bit line charging circuits 126, 132, 138, and 144. For example, the driver circuit 150 may be coupled to gate terminals of the transistors 128, 134, 140, and 146. The driver circuit 150 may include one or more amplifiers, such as one or more operational amplifiers (op amps).

The driver circuit 150 may be configured to apply multiple voltages 152 to the transistors 128, 134, 140, and 146. In the example of FIG. 1, the multiple voltages 152 include voltages V1, V2, V3, and V4. In other implementations, the multiple voltages 152 may include more than or fewer than four voltages.

The driver circuit 150 may be configured to control biasing of the plurality of bit lines 116 by selecting one of the multiple voltages 152 and providing the selected voltage to gate terminals of the transistors 128, 134, 140, and 146. For example, the driver circuit 150 may adjust an amount of charge provided from the supply nodes 130, 136, 142, and 148 to the plurality of bit lines 116 by controlling gate voltages of the transistors 128, 134, 140, and 146).

The counter 154 may be configured to store a value 156 indicating a cycle of a bit line charging process. An example of a bit line charging process is a bit line pre-charge process that pre-charges the plurality of bit lines 116 in connection with a write operation to the group of storage elements 106.

The one or more latches 158 may be configured to store data 160. The data 160 may include one or more logical pages, two logical pages in connection with an MLC implementation of the memory 104 or three logical pages in connection with a TLC implementation of the memory 104, as illustrative examples.

The data 160 may indicate programming states and one or more inhibit states for the group of storage elements 106 in connection with a write operation. For example, one or more values of the data 160 may indicate a programming state for the storage element 108 (e.g., an "A" state, as an illustrative example).

The data storage device 102 further includes a controller 170 coupled to the memory device 103. The controller 170 may include a front-end engine 172, a first interface 174 (e.g., a host interface or an access device interface), a second interface 176 (e.g., a memory interface), and a back-end engine 178.

The front-end engine 172 may be configured to control communications with the device 180 via the first interface 174. For example, the front-end engine 172 may be configured to receive commands from the device 180 via the first interface 174 and to perform operations in response to receiving the commands, such as by receiving data and a write request via the first interface 174 from the device 180 or by receiving a read request via the first interface 174 from the device 180.

The back-end engine 178 may be configured to control operations at the memory device 103 (e.g., in response to commands from the front-end engine 172). For example, the back-end engine 178 may include an error correcting code (ECC) engine configured to encode data to be stored in the memory 104 and to decode data accessed from the memory 104. As another example, the back-end engine 178 may be configured to send and receive control signals (e.g., a write enable signal or a read enable signal) using the second interface 176. As an additional example, the back-end engine 178 may include a command sequencer configured to sequence a set of commands (e.g., one or more write commands, one or more read commands, one or more erase commands, or a combination thereof) sent to the memory device 103.

The data storage device 102 and the device 180 may be coupled via a connection, such as a bus, a wireless connection, a network connection, another connection, or a combination thereof. The connection may include a bus interface, such as a serial advanced technology attachment (SATA) or peripheral component interface express (PCIe) interface. In an illustrative example, the bus interface may be a non-volatile memory express (NVMe) or fiber channel over Ethernet (FCoE) interface. The data storage device 102 may correspond to a solid state drive (SSD), which may be integrated within a computing device, such as a laptop computer, a tablet computer, or a desktop computer. In some implementations, the system 100, the data storage device 102, or the memory 104 may be integrated within a network-accessible data storage system, such as an enterprise data system, a network-attached storage (NAS) system, or a cloud data storage system, as illustrative examples.

During operation, the data storage device 102 may receive data 182 from the device 180 in connection with a request for write access to the memory 104. For example, the front-end engine 172 may receive the data 182 via the first interface 174. The back-end engine 178 may perform one or more operations based on the data 182 to generate the data 160. For example, the back-end engine 178 may encode the data 182 to generate the data 160. Alternatively or in addition, the back-end engine 178 may generate one or more logical pages based on the data 182, and the data 160 may include the one or more logical pages.

The back-end engine 178 may send the data 160 to the memory device 103 using the second interface 176. The memory device 103 may receive the data 160 using the one or more latches 158.

The bit line charging circuits 126, 132, 138, and 144 are configured to charge the plurality of bits lines 116 (e.g., to independently charge each bit line of the plurality of bit lines using multiple bit line voltages) based on a programming state indicated by the data 160 stored in the one or more latches 158. The programming state may be one of multiple states that are programmable to the group of storage elements 106, and the bit line charging circuits 126, 132, 138, and 144 may be configured to bias the plurality of bits lines 116 using a particular bit line voltage of the multiple bit line voltages that corresponds to the programming state.

To illustrate, FIG. 1 depicts that the multiple bit line voltages applied to the set of bit lines 116 may include bias voltages Ver, Va, Vb, and Vc. In an illustrative implementation, the bias voltage Ver corresponds to an erase ("Er") state, the bias voltage Va corresponds to an "A" state, the bias voltage Vb corresponds to a "B" state, and the bias voltage Vc corresponds to a "C" state.

The multiple bit line voltages include a set of bias voltages that correspond to a set of programming states that are programmable to the group of storage elements 106 using a write operation. For example, in a two-bit-per-cell implementation, the bias voltages Va, Vb, and Vc correspond to a set of programming states (an "A" state, a "B" state, and a "C" state) that are programmable to the group of storage elements 106 using a write operation. As used herein, a "programming state that is programmable using a write operation" may refer to a state that may be created using a programming pulse based on data, such as the data 160. In some implementations, an "Er" state may be created using an erase operation instead of a write operation (and thus the bias voltage Ver may not be included in the set of bias voltages corresponding to the set of programming states that are programmable to the group of storage elements 106).

The bias voltages Ver, Va, Vb, and Vc may be based on the multiple voltages 152. For example, the driver circuit 150 may be configured to apply one of the multiple voltages 152 to a gate terminal of the transistor 128 to apply one of bias voltages Ver, Va, Vb, and Vc to the bit line 118. In an illustrative implementation, the transistor 128 has a threshold voltage Vt, and Ver=V1−Vt, Va=V2−Vt, Vb=V2−Vt, and Vc=V3−Vt. In some implementations, Ver=VHIGH, where VHIGH is applied to a bit line to inhibit programming for a storage element coupled to the bit line.

To further illustrate, applying the voltage VHIGH to the bit line 118 may cause the storage element 108 to remain in an "Er" state during a write operation by reducing a voltage difference between the bit line 118 and a word line that receives a programming pulse 166 from the read/write circuitry 164. As a non-limiting illustrative example, if a voltage level of the programming pulse 166 is approximately four volts (V) and VHIGH is approximately four volts, then applying the voltage VHIGH to the bit line 118 may cause the storage element 108 to remain in an "Er" state during a write operation (e.g., by reducing or avoiding charge collection at the storage element 108 in connection with a flash memory implementation). Other voltages of the multiple bias voltages may be selected to enable programming to a particular state based on a difference between the particular bias voltage and the programming pulse 166. For example, a smaller bias voltage may be selected to increase a voltage difference between the bit line 118 and the storage element 108 in order to increase charge collection at the storage element 108.

In an illustrative implementation, the bit line charging process charges the plurality of bit lines 116 during multiple cycles (or stages). The value 156 stored by the counter 154 may correspond to the cycle of the bit line charging process.

The multiple cycles may include a first cycle to charge one or more of the plurality of bit lines 116 to the bias voltage Ver. For example, as described further with reference to FIG. 2, a pre-lockout scan operation may be performed during the first cycle to set the bias voltage Ver (e.g., a logic one voltage, such as VHIGH) at a first subset of the plurality of bit lines 116 that are to be inhibited from programming during a write operation. The pre-lockout scan operation may also include biasing a second subset of the plurality of bit lines 116 that are to be programmed during the write operation based on another voltage, such as a logic zero voltage (e.g., VSS). Biasing the first subset and the second subset differently (e.g., using VHIGH and VSS) during the pre-lockout scan may reduce a bit line coupling effect during the bit line charging process.

To further illustrate, the storage element 108 may be inhibited from programming during a write operation (e.g., to maintain an "Er" state at the storage element 108), so the bit line 118 may be biased based on the bias voltage Ver during the first cycle using the pre-lockout scan operation. The storage elements 110, 112, and 114 may be selected for programming (e.g., to an "A" state, a "B" state, and a "C" state, respectively) during the write operation, so the bit lines 120, 122, and 124 may be biased based on the logic zero voltage during the first cycle using the pre-lockout scan operation. In some cases, the driver circuit 150 may deactivate the transistors 128, 134, 140, and 146 during the pre-lockout scan operation, such as by applying the voltage V1 to gate terminals of the transistors 128, 134, 140, and 146, where the voltage V1 is a logic zero voltage (e.g., VSS).

After the first cycle, one or more bit lines of the plurality of bit lines 116 may maintain the bias voltage Ver while one or more other bit lines of the plurality of bit lines 116 may be charged (e.g., by increasing the logic zero voltage to the bias voltage Va, to the bias voltage Vb, or to the bias voltage Vc). Thus, the plurality of bit lines 116 may be charged independently (e.g., by maintaining a bias voltage at one or more bit lines of the plurality of bit lines 116 while increasing a bias voltage at one or more other bit lines of the plurality of bit lines 116).

During one or more cycles after the first cycle of the bit line charging process, one or more other storage elements of the group of storage elements 106 may be targeted for another state based on the data 160, such as an "A" state, a "B" state, or a "C" state. To illustrate, FIG. 1 depicts that the storage elements 110, 112, and 114 may be targeted for an "A" state, a "B" state, and a "C" state, respectively.

In this case, the bit line charging circuits 132, 138, and 144 may charge the bit lines 120, 122, and 124 using the supply nodes 136, 142, and 148 during a second cycle of the bit line charging process (e.g., while the bit line 118 "floats" based on the bias voltage Ver). During the second cycle, the bit line charging circuits 132, 138, and 144 may increase the logic zero voltage (e.g., VSS) at the bit lines 120, 122, and 124 to the bias voltage Va. For example, the driver circuit 150 may apply one of the multiple voltages 152 to generate the bias voltage Va at the bit lines 120, 122, and 124, such as by biasing gate terminals of the transistors 134, 140, and 146 using the voltage V2 to generate the bias voltage Va at the bit lines 120, 122, and 124.

One or more other storage elements of the group of storage elements 106 may be targeted for another state based on the data 160, such as a "B" state or a "C" state. To illustrate, FIG. 1 depicts that the storage elements 112, 114 may be targeted for a "B" state and a "C" state, respectively.

In this case, the bit line charging circuits 138 and 144 may continue to charge the bit lines 122, 124 using the supply nodes 142, 148 during a third cycle of the bit line charging process (e.g., while the bit line 118 "floats" based on the bias voltage Ver and while the bit line 120 "floats" based on the bias voltage Va). During the third cycle, the bit line charging circuits 138, 144 may increase the bias voltage Va to the bias voltage Vb. For example, the driver circuit 150 may apply one of the multiple voltages 152 to generate the bias voltage Vb at the bit lines 122 and 124, such as by biasing gate terminals of the transistors 140 and 146 using the voltage V3 to generate the bias voltage Vb at the bit lines 122, 124.

One or more other storage elements of the group of storage elements 106 may be targeted for another state based on the data 160, such as a "C" state. To illustrate, FIG. 1 depicts that the storage element 114 may be targeted for a "C" state.

In this case, the bit line charging circuit 144 may continue to charge the bit line 124 using the supply node 148 during a fourth cycle of the bit line charging process (e.g., while the bit lines 118, 120, and 122 "float" based on the bias voltages Ver, Va, and Vb, respectively). During the fourth cycle, the bit line charging circuit 144 may increase the bias voltage Vb to the bias voltage Vc. For example, the driver circuit 150 may apply one of the multiple voltages 152 to generate the bias voltage Vc at the bit line 124, such as by biasing a gate terminal of the transistor 146 using the voltage V4 to generate the bias voltage Vc at the bit line 124.

Thus, the plurality of bit lines 116 may be charged independently (e.g., to different bias voltages, such as the bias voltages Ver, Va, Vb, and Vc) using a bit line charging process. The bit line charging process may enable programming of the group of storage elements 106 based on a single programming pulse 166 (e.g. using a one shot programming (OSP) technique) during a write operation that occurs after the bit line charging process. For example, after performing the bit line charging process, the plurality of bit lines 116 may "float" at bias voltages that correspond to programming states for the group of storage elements 106. If the programming pulse 166 is applied to the group of storage elements 106 (e.g., by applying the programming pulse 166 to gate terminals of the group of storage elements 106 in connection with a flash memory implementation), then the bias voltages applied to the bit lines may create programming states at the group of the storage elements 106 corresponding to the data 160 (e.g., based on a difference between a voltage level of the programming pulse 166 and the particular bias voltage applied at each of the plurality of bit lines 116).

Thus, multiple bias voltages (e.g., the bias voltages Va, Vb, and Vc) may enable programming of the group of storage elements 106 based on a single programming pulse 166 applied to the group of storage elements 106 during a write operation, such as by enabling a first bit line (e.g., one of the bit lines 118, 120, 122, and 124) to be biased independently of a second bit line (e.g., another of the bit lines 118, 120, 122, and 124). Independently biasing the first bit line and the second bit line may enable the single programming pulse 166 to program a first programming state (e.g., one of an "A" state, a "B" state, and a "C" state, as illustrative examples) to a first storage element (e.g., one of the storage elements 108, 110, 112, and 114) and a second programming state (e.g., another of the "A" state, the "B" state, and the "C" state, as illustrative examples) to a second storage element (e.g., another of the storage elements 108, 110, 112, and 114).

To further illustrate, if the bit line 118 is biased based on the bias voltage Ver, then the programming pulse 166 may produce (or maintain) an "Er" state at the storage element 108 (e.g., the bias voltage Ver may inhibit programming of the storage element 108) during a write operation. One or more other bias voltages may enable the programming pulse 166 to generate one or more programming states at the group of storage elements 106 during the write operation. For example, if the bit line 120 is biased based on the bias voltage Va, then the programming pulse 166 may generate an "A" state at the storage element 110. As an additional example, if the bit line 122 is biased based on the bias voltage Vb, then the programming pulse 166 may generate a "B" state at the storage element 112. As another illustration, if the bit line 124 is biased based on the bias voltage Vc, then the programming pulse 166 may generate a "C" state at the storage element 114.

In some implementations, the memory device 103 may be configured to charge particular groups of bit lines of the plurality of bit lines 116, such as in connection with an even/odd (E/O) bit line charging process. To illustrate, the memory device 103 may be configured to charge a first group of the plurality of bit lines 116 at a first time, such as by charging bit lines that are associated with odd numbered indices (e.g., one, three, five, etc.). The memory device 103 may be configured to charge a second group of the plurality of bit lines 116 at a second time after the first time, such as by charging bit lines that are associated with even numbered indices (e.g., two, four, six, etc.). The E/O bit line charging process may sequentially charge the first group and the second group to compensate for capacitance between adjacent bit lines (e.g., capacitance between the bit lines 118, 120, an illustrative example).

In some implementations, a number of bit line charging circuits included in the set of bit line charging circuits 125 may be less than a number of storage elements of the group of storage elements 106, such as if the storage elements 108, 110 "share" the bit line charging circuit 126 and if the storage elements 112, 114 "share" the bit line charging circuit 132. In this example, the bit line charging circuits 126, 132 may be omitted from the memory device 103.

In other implementations, another bit line charging process may be performed, such as an all bit lines (ABL) charging process that concurrently charges each bit line of the plurality of bit lines 116. A decision to select E/O or ABL may be determined based on an amount of time taken for a current (e.g., Icell) of a target bit line to settle to within a certain amount (e.g., 10%) of a target current during bit line settling.

Independently charging each bit line of the plurality of bit lines 116 using the set of bit line charging circuits 125 may enable multiple bias voltages at the plurality of bit lines 116 when a write operation to the group of storage elements 106 is initiated. The multiple bias voltages may enable programming of the group of storage elements 106 using a single programming pulse 166 (e.g., using an OSP technique), such as by avoiding separately biasing and programming different subsets of storage elements, as in some devices. Hence, programming latency is reduced in some applications, which may increase write operation speed.

Figure 2:
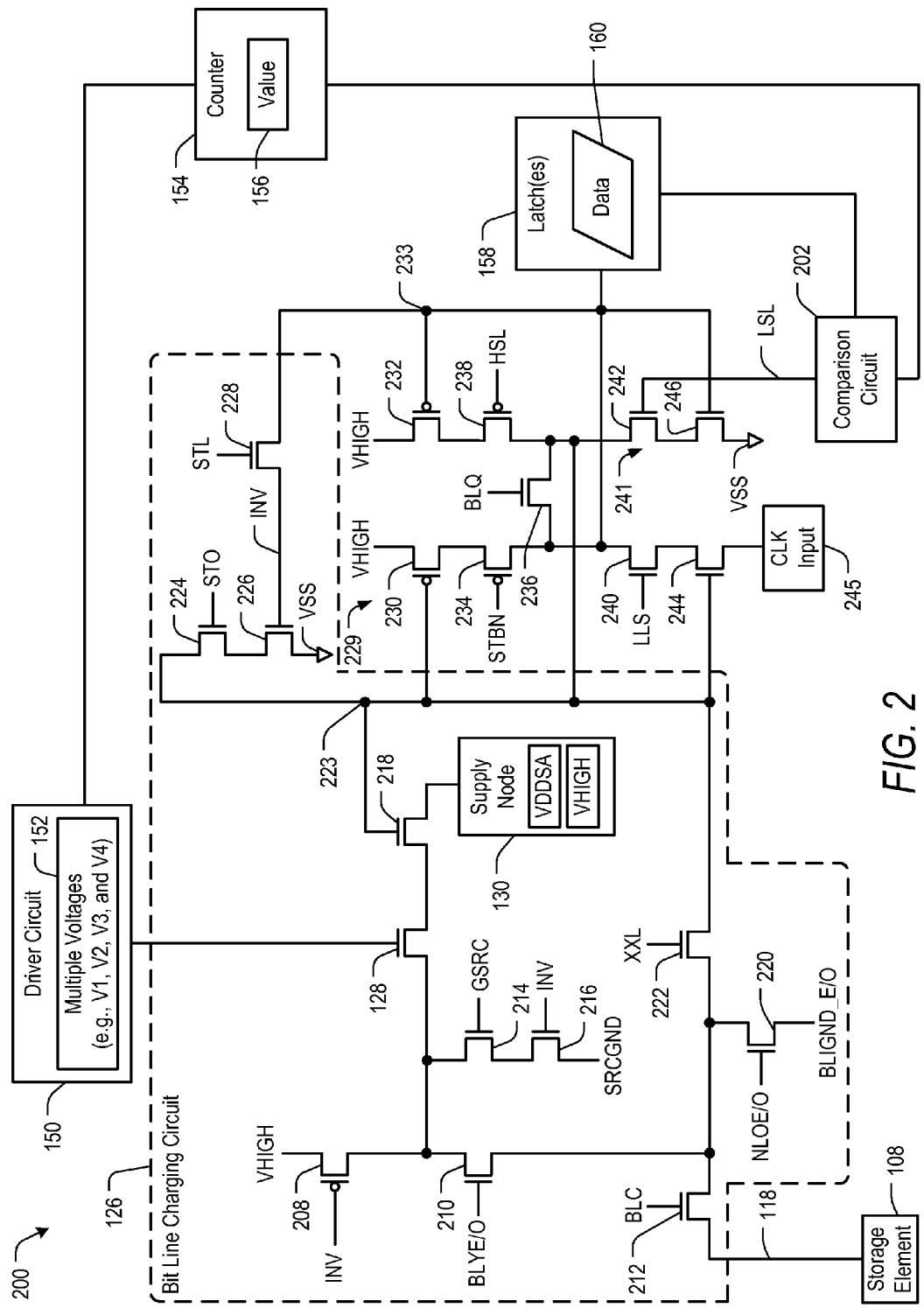
FIG. 2 is a diagram of a particular illustrative example of a device that includes a bit line charging circuit, such as the bit line charging circuit of FIG. 1.

FIG. 2 is a diagram of a particular illustrative example of a device 200 that includes a bit line charging circuit, such as the bit line charging circuit 126 of FIG. 1. The bit line charging circuit 126 is coupled to the bit line 118, and the bit line 118 is coupled to the storage element 108. The bit line charging circuit 126 includes the transistor 128 and the supply node 130.

The device 200 may also include the driver circuit 150, the one or more latches 158, and the counter 154. FIG. 2 also illustrates that the device 200 may include a comparison circuit 202 coupled to the counter 154. The counter 154 may be coupled to the driver circuit 150 and to the comparison circuit 202. The bit line charging circuit 126 is coupled to the one or more latches 158, to the comparison circuit 202, and to the counter 154. The counter 154 may be configured to store the value 156 indicating a cycle of a bit line charging process, such as the bit line charging process described with reference to FIG. 1.

FIG. 2 illustrates that the driver circuit 150 may be coupled to a gate terminal of the transistor 128. The driver circuit 150 may be configured to apply multiple voltages to the transistor 128, such as by applying one of the multiple voltages 152 to the gate terminal of the transistor 128.

The bit line charging circuit 126 may further include a transistor 208. A source terminal of the transistor 208 may be responsive to a voltage VHIGH (e.g., a supply voltage, such as VDD). A gate terminal of the transistor 208 may be responsive to another signal generated by the bit line charging circuit 126, such as a signal INV.

The bit line charging circuit 126 may further include a transistor 210 coupled to the transistor 208. A gate terminal of the transistor 210 may be responsive to a signal BLYE/O. The transistor 210 may be coupled to a transistor 212. The transistor 212 may be responsive to a signal BLC, and the transistor 212 may be coupled to the bit line 118.

The bit line charging circuit 126 may further include a transistor 216 and a transistor 214. The transistor 214 may be responsive to a signal GSRC. The transistor 216 may be responsive to the signal INV and to a signal SRCGND. A supply transistor (e.g., a transistor 218) may be coupled to the transistor 128 and to the supply node 130. A gate terminal of the transistor 218 may be coupled to a node 223 (also referred to herein as a SEN node).

The supply node 130 may be configured to apply multiple supply voltages to the transistor 218 (e.g., to a source-or-drain (S/D) terminal of the transistor 218). The example of FIG. 2 illustrates that the supply node 130 may provide a voltage VDDSA and the voltage VHIGH to an S/D terminal of the transistor 218.

The bit line charging circuit 126 may further include a transistor 220 and a transistor 222. The transistor 222 may be responsive to a signal NLOE/O and to a signal BLIGND_E/O. The transistor 222 may be responsive to a signal XXL.

The bit line charging circuit 126 may further include a transistor 224, a transistor 226, and a transistor 228. The transistor 224 may be responsive to a signal STO. The transistor 226 may be responsive to the signal INV and the transistor 228 may be responsive to the signal STL.

The bit line charging circuit further includes a transistor 230, a transistor 232, a transistor 234, a transistor 236, and a transistor 238. The transistors 230, 232 may each include a source terminal responsive to the voltage VHIGH. The transistor 234 may be responsive to a signal STBN, the transistor 236 may be responsive to a signal BLQ, and the transistor 238 may be responsive to a signal HSL.

The bit line charging circuit 126 may also include a transistor 240, a transistor 242, a transistor 244, and a transistor 246. The transistor 240 may be responsive to a signal LLS. The transistor 242 may be responsive to a signal LSL generated by the comparison circuit 202. The transistor 244 may be coupled to a clock (CLK) input 245, and the transistor 246 may be coupled to a ground node.

The transistors 230, 232, 234, 236, 238, 240, 242, 244, and 246 may form cross-coupled inverters 229, such as a latch having a cross-coupled inverter configuration. In a particular implementation, the cross-coupled inverters 229 form a sense amplifier (sense amp) associated with the storage element 108. The sense amp may be configured to receive a value associated with the storage element 108 during a read process associated with the group of storage elements 106 of FIG. 1. The node 223 may correspond to a first input or output of the cross-coupled inverters 229, and a node 233 may correspond to a second input or output of the cross-coupled inverters 229.

The node 233 may be coupled to the one or more latches 158 and to the transistors 228, 232, 238, and 246. In some implementations, the node 233 corresponds to (or is included in) a bus. For example, the node 233 may correspond to a lane of a multi-lane bus. To further illustrate, each lane of the multi-lane bus may correspond to a respective storage element of the group of storage elements 106 of FIG. 1, and the node 233 may correspond to the storage element 108.

Although certain features of FIG. 2 are described for illustration, it should be understood that alternative implementations are within the scope of the disclosure. For example, although FIG. 2 depicts certain illustrative n-type and p-type transistors, it should be appreciated that the choice of an n-type transistor or a p-type transistor may depend on the particular application. As an illustrative example, although the transistor 128 may correspond to an n-type metal-oxide-semiconductor field-effect transistor (nMOSFET), in other implementations, the transistor 128 may correspond to a p-type metal-oxide-semiconductor field-effect transistor (pMOSFET) or another type of transistor.

During operation, the bit line charging circuit 126 may perform or control a bit line charging process to charge a bit line, such as the bit line 118. The bit line charging process may include a pre-lockout scan operation to initialize voltages at the plurality of bit lines 116 of FIG. 1. The pre-lockout scan operation may include adjusting voltages at SEN nodes of the set of bit line charging circuits 125 (e.g., the node 223 of the bit line charging circuit 126) based on the data 160. To illustrate, SEN nodes of storage elements of the group of storage elements 106 to be programmed (e.g., to an "A" state, to a "B" state, or to a "C" state, as illustrative examples) may receive a logic zero voltage (e.g., VSS) during the pre-lockout scan operation. SEN nodes of storage elements of the group of storage elements 106 to be inhibited from programming (e.g., to remain in an "Er" state, as an illustrative example) may receive another voltage (e.g., a logic one voltage, such as VHIGH) during the pre-lockout scan operation.

During the pre-lockout scan operation, the driver circuit 150 may cause the transistor 128 to remain deactivated (e.g., by providing a low bias voltage or no bias voltage to a gate terminal of the transistor 128 so that a channel of the transistor 128 is deactivated). The transistor 222 may be activated during the pre-lockout scan operation (e.g., by applying a logic one voltage to the transistor 222 using the signal XXL).

To further illustrate, if the storage element 108 is to be inhibited from programming during a write operation based on the data 160, the node 233 may have a logic zero voltage (e.g., indicating that the storage element 108 is to remain in the "Er" state based on the data 160) during the pre-lockout scan operation. The cross-coupled inverters 229 may invert the logic zero voltage at the node 233 to generate a logic one voltage at the node 223.

The signal INV may have a logic zero voltage (e.g., the transistor 228 may "pull down" the signal INV based on the logic zero voltage at the node 233). The logic zero voltage of the signal INV may activate the transistor 208. The transistor 208 may charge the bit line 118 based on the voltage VHIGH (e.g., via the transistors 210, 212), resulting in the bias voltage Ver at the bit line 118 (e.g., where Ver is equal to or is approximately equal to VHIGH). Applying the bias voltage Ver to the bit line 118 may inhibit programming of the storage element 108 during a write operation to the group of storage elements 106 of FIG. 1 (e.g., if the bias voltage Ver is approximately equal to a voltage level of the programming pulse 166 applied to the group of storage elements 106 during the write operation).

In other cases, the data 160 may indicate that the storage element 108 is to be programmed during a write operation (instead of indicating that the storage element 108 is to be inhibited from being programmed during the write operation). In this case, the node 233 may have a logic one voltage (e.g., indicating, based on the data 160) that the storage element 108 is to be programmed to an "A" state, to a "B" state, or to a "C" state, as illustrative examples) during the pre-lockout scan operation. The cross-coupled inverters 229 may invert the logic one voltage at the node 233 to generate a logic zero voltage at the node 223. The logic zero voltage at the node 223 may deactivate the transistor 218 to (e.g., to decouple the supply node 130 from the bit line 118).

The logic one voltage at the node 233 may cause the signal INV to have a logic one voltage, such as by causing the transistor 228 to "pull up" the signal INV based on the logic one voltage at the node 233. The logic one voltage of the signal INV may deactivate the transistor 208 (e.g., to decouple the bit line 118 from the voltage VHIGH). Further, the logic one voltage of the signal INV may activate the transistor 226 to cause the transistor 226 to couple the node 223 to a ground node (via the transistor 224). The bit line 118 may be coupled to the ground node via a path that includes the transistors 212, 222, the node 223, and the transistors 224, 226, resulting in a low bias at the bit line 118 (e.g., VSS).

After the pre-lockout scan operation, bit lines of the plurality of bit lines 116 coupled to storage elements of the group of storage elements 106 to be inhibited from programming during a write operation may store the bias voltage Ver (e.g., VHIGH). Bit lines of the plurality of bit lines 116 coupled to storage elements of the group of storage elements 106 to be programmed during a write operation may store another bias voltage (e.g., a logic zero voltage, such as VSS).

After performing the pre-lockout scan operation to initialize bias voltages at the plurality of bit lines 116 of FIG. 1, an operation may be performed to cause one or more of the plurality of bit lines 116 of FIG. 1 to "float." For example, if the storage element 108 is to be programmed for a write operation, the transistor 222 may be deactivated (e.g., by applying a logic zero voltage to a gate terminal of the transistor 222 using the signal XXL) to cause the bit line 118 to "float" at the particular bias voltage (e.g., a logic zero voltage, such as VSS). As another example, if the storage element 108 is to be inhibited from programming for a write operation, one or more of the transistors 212, 222, and 228 may be deactivated to cause the bit line 118 to "float" at the particular bias voltage (e.g., a logic one voltage, such as VHIGH).

After performing the operation to cause one or more of the plurality of bit lines 116 of FIG. 1 to "float," SEN nodes of the set of bit line charging circuits 125 of FIG. 1 may be "reset" (e.g., to a logic one voltage). For example, the one or more latches 158 may provide a logic zero voltage to the node 233, and the cross-coupled inverters 229 may invert the logic zero voltage to generate a logic one voltage at the node 223.

After "resetting" the SEN nodes, the bit line charging process may include biasing one or more bit lines of the plurality of bit lines 116 using the driver circuit 150. For example, referring again to FIG. 1, bit lines corresponding to corresponding to storage elements to be programmed may be biased using the driver circuit 150 while bit lines corresponding to storage elements to be inhibited from programming "float" at the bias voltage Ver.

The driver circuit 150 may be configured to increase a voltage applied to a gate terminal of the transistor 128 to change bias voltages at the plurality of bit lines 116 of FIG. 1. For example, the driver circuit 150 may be configured to increase the voltage applied to the gate terminal of the transistor in "steps" (e.g., from V1 to V2, from V2 to V3, and from V3 to V4) to generate bias voltages (e.g., Va, Vb, and Vc at the plurality of bit lines 116) corresponding to programming states (e.g., an "A" state, a "B" state, and a "C" state) for the group of storage elements 106.

To further illustrate, Table 1 shows illustrative values of the multiple voltages 152 that the driver circuit 150 may apply to the gate terminal of the transistor 128. In the example of Table 1, the first column may correspond to programming states that are programmable to the group of storage elements 106 of FIG. 1, the second column may correspond to cycles of the bit line process indicated by the value 156, the third column may correspond to values of the multiple voltages 152 expressed with reference to a threshold voltage (Vt) of the transistor 128, the fourth column may correspond to values of a supply voltage at the supply node 130, and the fifth column may correspond to the multiple bias voltages described with reference to FIG. 1. It should be appreciated that Table 1 is provided for illustration and that the particular values and number of cycles may be selected based on the particular application. Further, although Table 1 is described with reference to an illustrative three-bits-per-cell storage scheme that may program one of eight states (i.e., states "Er," "A," "B," . . . "G") to a storage element, in other applications, another storage scheme may be used (e.g., a two-bits-per-cell storage scheme, a four-bits-per-cell storage scheme, or another storage scheme).

TABLE 1

| State indicated by data 160 | Value 156 | Driver circuit 150 (V) | Supply node 130 | Bit line 118 (V) |
| --- | --- | --- | --- | --- |
| Er | 1 | 0 + Vt | VDDSA | 4 |
| A | 2 | 0.3 + Vt | VDDSA | 0.3 |
| B | 3 | 0.6 + Vt | VDDSA | 0.6 |
| C | 4 | 0.9 + Vt | VDDSA | 0.9 |
| D | 5 | 1.2 + Vt | VDDSA | 1.2 |
| E | 6 | 1.5 + Vt | VHIGH | 1.5 |
| F | 7 | 1.8 + Vt | VHIGH | 1.8 |
| G | 8 | 2.1 + Vt | VHIGH | 2.1 |

The driver circuit 150 may provide one of the multiple voltages 152 to the transistor 128 based on the data 160 and based on a cycle indicated by the value 156 of the counter 154. For example, in response to the second cycle of the bit line charging process indicated by the value 156, the driver circuit 150 may apply the voltage V2 to the transistor 128 (e.g., where V2=4+Vt) in response to the data 160 indicating that the storage element 108 is to be programmed (e.g., to an "A" state, to a "B" state, or to a "C" state, as illustrative examples). Applying the voltage V2 to the transistor 128 may cause a voltage Va at the bit line 118 (e.g., where Va=V2−Vt=4).

The comparison circuit 202 may be configured to selectively disable charging of the bit line 118 based on the data 160 (e.g., to decouple the bit line 118 from the supply node 130 to cause the bit line 118 to "float" in response to the bit line 118 reaching a particular bias voltage). As an example, the comparison circuit 202 may be configured to compare a programming state for the storage element 108 indicated by the data 160 to a particular cycle of the bit line charging process.

If the programming state differs from the particular cycle of the bit line charging process, then the particular bias voltage applied to the bit line 118 may be adjusted using the driver circuit 150 (e.g., by adjusting one of the multiple voltages 152 applied to the transistor 128, such as from the voltage V2 to the voltage V3 to enable programming of the storage element 108 to a "B" state).

If the programming state corresponds to the particular cycle of the bit line charging process, the comparison circuit 202 may apply a logic one voltage to the transistor 242 to couple the node 223 to a ground node (e.g., to "pull down" the node 223). Pulling down the node 223 may deactivate the transistor 218 and may cause the bit line 118 to "float."

Applying the logic one voltage to the transistor 242 is also referred to herein as a state-dependent SEN discharge (SDSD) operation that discharges the node 223 via a discharge path 241 that includes the transistors 242, 246. For example, discharging the node 223 via the discharge path 241 may be based on a bias voltage at the bit line 118 corresponding to a programming state for the storage element 108 that is indicated by the data 160.

The driver circuit 150 may sequentially apply the multiple voltages 152 to the set of bit line charging circuits 125 of FIG. 1, and each bit line charging circuit of the set of bit line charging circuits 125 may perform an SDSD operation to enable independent charging of the plurality of bit lines 116. Independently charging each of the plurality of bit lines 116 may simplify certain operations at a memory. For example, independently charging each of the plurality of bit lines 116 may enable programming of the group of storage elements 106 using a single programming pulse (e.g., the programming pulse 166).

Figure 3:
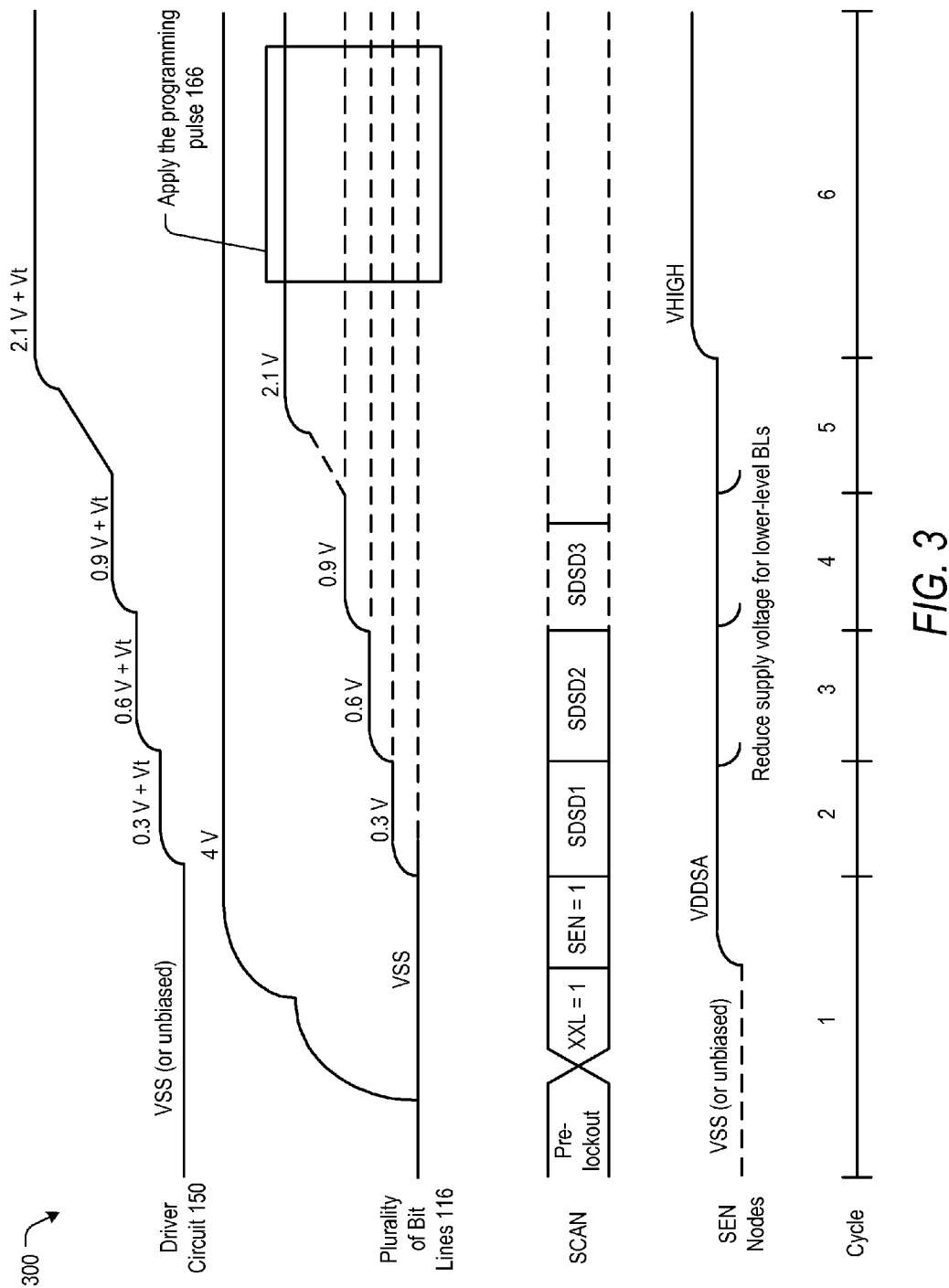
FIG. 3 is a timing diagram illustrating particular illustrative examples of operations that may be performed at a data storage device, such as at the data storage device of FIG. 1.

FIG. 3 depicts a timing diagram 300 illustrating particular illustrative examples of operations that may be performed at a data storage device. For example, the operations may be performed by the memory device 103 of the data storage device 102 of FIG. 1.

The timing diagram 300 illustrates certain illustrative operations that may be performed using the driver circuit 150, the plurality of bit lines 116, and SEN nodes of the group of bit line charging circuits 125 (e.g., the node 223 of the bit line charging circuit 126). The timing diagram 300 also illustrates certain other illustrative operations ("SCAN") that may be performed at the set of bit line charging circuits 125 and a set of cycles (e.g., cycles 1, 2, 3, 4, 5, 6, 7, and 8) of a bit line charging process (e.g., the cycles of the bit line charging process described with reference to FIG. 1, which may be indicated by the value 156 of the counter 154 in some implementations).

During cycle 1, a pre-lockout scan operation may be performed (e.g., the pre-lockout scan operation described with reference to FIG. 2). During the pre-lockout scan operation, the driver circuit 150 may bias the gate terminal of the transistor 128 using a logic zero voltage (e.g., VSS), or the gate terminal of the transistor 128 may be unbiased. As a result, the plurality of bit lines 116 may be biased based on a logic zero voltage, or the plurality of bit lines 116 may be unbiased.

The pre-lockout scan operation may include setting the bias voltage Ver of FIG. 1 (e.g., the voltage VHIGH, such as 4 V) at one or more of the plurality of bit lines 116 that are to be inhibited from programming during a write operation. The pre-lockout scan operation may also include biasing one or more of the plurality of bit lines 116 that are to be programmed during the write operation based on another voltage (e.g., VSS). Referring again to the example of FIG. 1, the storage element 108 may be targeted for an "Er" state, and the storage elements 110, 112, and 114 may be targeted for an "A" state, a "B" state, and a "C" state, respectively. In this example, the pre-lockout scan operation may include biasing the bit line 118 based on the bias voltage Ver (e.g., the voltage VHIGH, such as 4 V) and may also include biasing the bit lines 120, 122, and 124 based on another voltage (e.g., VSS).

In some implementations, operations of the timing diagram 300 are performed in connection with an even/odd (E/O) bit line charging process. For example, operations of the timing diagram 300 may be performed for even (or odd) indexed bit lines while odd (or even) bit lines are biased using a logic one voltage (e.g., VHIGH, such as 4 V). After performing the operations for the even (or odd) indexed bit lines, operations of the timing diagram 300 may be performed for odd (or even) indexed bit lines while even (or odd) bit lines are biased using a logic one voltage (e.g., VHIGH, such as 4 V).

After the pre-lockout scan operation, the signal XXL may be transitioned to a logic one voltage. As an example, for bit lines coupled to storage elements that are to be programmed using a write operation, the SEN nodes (e.g., the node 223) associated with the bit lines may be decoupled from the bit lines using a logic one voltage of the signal XXL (e.g., by decoupling the bit line 118 from the node 223 by deactivating the transistor 222 of FIG. 2). In this case, the bit lines may "float" (e.g., the bit line 118 may "float" by decoupling the bit line 118 from a ground path that includes the transistor 222, the node 223, and the transistors 224, 226).

One or more SEN nodes of the set of bit lines 116 may be adjusted to a logic one voltage. For example, after the transistor 222 is deactivated in response to a logic zero voltage using the signal XXL, the node 223 may be adjusted from a logic zero voltage to a logic one voltage. For example, the one or more latches 158 or the comparison circuit 202 may apply a logic zero voltage to the node 233, and the cross-coupled inverters 229 may invert the logic zero voltage to generate a logic one voltage at the node 223. In an illustrative implementation, the SEN nodes are increased from the voltage VSS to the voltage VDDSA.

During cycle 2, one or more bit lines of the plurality of bit lines 116 may be maintained at the voltage VSS to inhibit one or more storage elements from programming, and one or more other bit lines of the plurality of bit lines 116 may be increased from the voltage VSS to 0.3 V. As an example, 0.3

V may correspond to a bias voltage for bit lines coupled to storage elements targeted for an "A" state.

Referring again to FIG. 1, if the storage element 108 is targeted for an "Er" state, then the bit line 118 may be maintained at the voltage VSS. If the storage element 110 is targeted for an "A" state based on the data 160, then the bit line 120 may be biased based on the voltage Va (e.g., by increasing the bit line 120 from the voltage VSS to the bias voltage 0.3 V). If the storage elements 112, 114 are targeted for a "B" state and a "C" state based on the data 160, then the bit lines 122, 124 may be increased from the voltage VSS to the bias voltage 0.3 V. For example, the driver circuit 150 may increase one of the multiple voltages 152 applied to the transistors 134, 140, and 146 from V1 to V2=0.3 V+Vt.

The operations of FIG. 3 may also include increasing a bias voltage at one or more bit lines from 0.3 V to 0.6 V (e.g., for bit lines coupled to storage elements targeted for a "B" state). FIG. 3 also depicts increasing a bias voltage at one or more bit lines from 0.6 V to 0.9 V (e.g., for bit lines coupled to storage elements targeted for a "C" state) and from 0.9 V to 2.1 V (e.g., for bit lines coupled to storage elements targeted for a "G" state).

In response to a bit line reaching a particular bias voltage corresponding to a target programming state for a storage element, an SDSD operation may be performed to discharge a voltage at a SEN node of a bit line charging circuit. To illustrate, after the bit line 118 of FIGS. 1 and 2 reaches a particular bias voltage corresponding to a target programming state for the storage element 108, the comparison circuit 202 may initiate an SDSD operation to decouple the supply node 130 from the bit line 118 by discharging the node 223 via the transistors 242, 246.

Further, in response to a bit line reaching a particular bias voltage corresponding to a target programming state for a storage element, a supply voltage may be reduced for the bit line. To illustrate, after the bit line 118 of FIGS. 1 and 2 reaches a particular bias voltage corresponding to a target programming state for the storage element 108, the supply voltage of the supply node 130 may be reduced (e.g., from VDDSA to VSS or from VHIGH to VSS, depending on the particular programming state for the storage element 108).

After performing the bit line charging process to charge bit line of the plurality of bit lines 116 to bias voltages that correspond to programming states for the group of storage elements 106, the programming pulse 166 may be applied to the group of storage elements 106 (e.g., via a word line). In an illustrative implementation, a single programming pulse 166 is applied to the group of storage elements 106 after performing the bit line charging process to write the data 160 to the group of storage elements 106.

The operations described with reference to FIG. 3 may improve operation of a data storage device. For example, using a single programming pulse 166 to write the data 160 to the group of storage elements 106 may reduce latency of a write operation and/or power consumption associated with the write operation.

Figure 4:
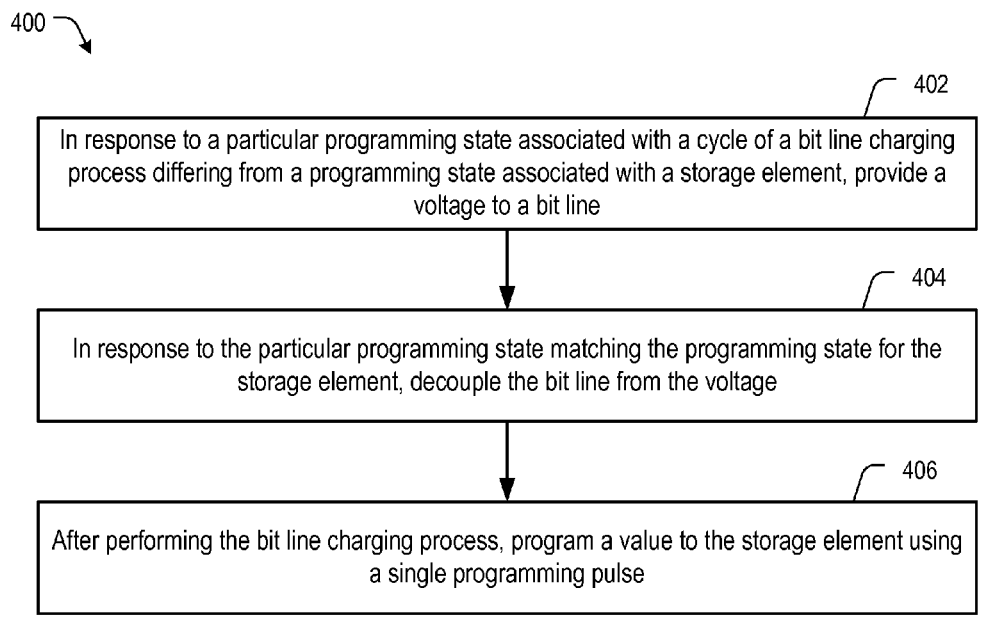
FIG. 4 is a flow chart of a particular illustrative embodiment of a method of operation of a data storage device, such as the data storage device of FIG. 1.

Referring to FIG. 4, a particular illustrative example of a method is depicted and generally designated 400. The method 400 may be performed in a data storage device, such as the data storage device 102 of FIG. 1) that includes a storage element and a bit line associated with the storage element (e.g., the storage element 108 and the bit line 118, the storage element 110 and the bit line 120, the storage element 112 and the bit line 122, or the storage element 114 and the bit line 124).

The method 400 includes providing a voltage to the bit line in response to a particular programming state associated with a cycle of a bit line charging process differing from a programming state associated with the storage element, at 402. For example, the voltage provided to the bit line may correspond to one of the multiple bit line voltages described with reference to FIG. 1 (Ver, Va, Vb, and Vc), one of the bit line voltages described with reference to Table 1 and FIG. 3, or another voltage. To further illustrate, the voltage may be provided to the bit line using an iterative technique. For example, the method 400 may include increasing the voltage of the bit line, and in response to increasing the voltage of the bit line, determining whether the particular programming state matches the programming state associated with the storage element.

The method 400 further includes decoupling the bit line from the voltage in response to the particular programming state matching the programming state for the storage element, at 404. To illustrate, the method 400 may optionally include activating a discharge path (e.g., the discharge path 241) in response to the cycle corresponding the programming state. Activating the discharge path may decouple the bit line from a supply node (e.g., the supply node 130) by discharging a voltage at a node (e.g., the node 223) coupled to the supply node and by deactivating a supply transistor (e.g., the transistor 218) in response to discharging the voltage at the node.

The method 400 further includes programming a value to the storage element using a single programming pulse after performing the bit line charging process, at 406. For example, the programming pulse 166 may be applied to the group of storage elements 106 after the plurality of bit lines 116 is charged based on the bit line charging process.

The method 400 may be performed to pre-charge each bit line of a plurality of bit lines independently of other bit line lines of the plurality of bit lines. Independently pre-charging each bit line may enable programming of a plurality of storage elements using a single programming pulse, which may simplify certain aspects of a write operation at a data storage device.

In an illustrative example, an apparatus includes a group of storage elements (e.g., the group of storage elements 106) including a first storage element (e.g., one of the storage elements 108, 110, 112, and 114) and a second storage element (e.g., another of the storage elements 108, 110, 112, and 114). The apparatus further includes a first bit line (e.g., one of the bit lines 118, 120, 122, and 124) coupled to the first storage element and also includes a second bit line (e.g., another of the bit lines 118, 120, 122, and 124) coupled to the second storage element. The apparatus further includes a first bit line charging circuit (e.g., one of the bit line charging circuits 126, 132, 138, and 144) and a second bit line charging circuit (e.g., another of the bit line charging circuits 126, 132, 138, and 144). The first bit line charging circuit is coupled to the first bit line and is configured to charge the first bit line to a first bias voltage of multiple bias voltages (e.g., to one of the multiple bias voltages Va, Vb, and Vc, as illustrative examples) based on a first programming state (e.g., one of an "A" state, a "B" state, and a "C" state, as illustrative examples). The second bit line charging circuit is coupled to the second bit line and is configured to charge the second bit line to a second bias voltage of the multiple bias voltages (e.g., to another of the multiple bias voltages Va, Vb, and Vc) based on a second programming state (e.g., another of the the "A" state, the "B" state, and the "C" state, as illustrative examples). The second programming state is different than the first programming state.

Although various components depicted herein are illustrated as block components and described in general terms, such components may include one or more microprocessors, state machines, or other circuits configured to enable such components to perform one or more operations described herein. For example, one or more of the counter 154 or the comparison circuit 202 may represent physical components, such as hardware controllers, state machines, logic circuits, or other structures, to enable the memory device 103 to independently charge the plurality of bit lines 116 based on multiple programming states.

Alternatively or in addition, one or more components described herein may be implemented using a microprocessor or microcontroller configured to perform operations, such as one or more operations described with reference to the timing diagram 300 of FIG. 3, one or more operations described with reference to the method 400 of FIG. 4, or a combination thereof. For example, the controller 170 may include one or more processors that execute instructions. In a particular embodiment, the controller 170 includes a processor configured to retrieve and execute instructions (e.g., firmware) that are stored at the memory 104. Alternatively or in addition, instructions that are executed by the processor may be stored at a separate memory location, such as at a read-only memory (ROM).

The data storage device 102 may be coupled to, attached to, or embedded within one or more accessing devices, such as within a housing of the device 180. For example, the data storage device 102 may be embedded within the device 180 in accordance with a Joint Electron Devices Engineering Council (JEDEC) Solid State Technology Association Universal Flash Storage (UFS) configuration. To further illustrate, the data storage device 102 may be integrated within an electronic device (e.g., the device 180), such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory.

In one or more other implementations, the data storage device 102 may be implemented in a portable device configured to be selectively coupled to one or more external devices, such as a host device. For example, the data storage device 102 may be removable from the device 180 (i.e., "removably" coupled to the device 180). As an example, the data storage device 102 may be removably coupled to the device 180 in accordance with a removable universal serial bus (USB) configuration.

The device 180 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The device 180 may communicate via a controller, which may enable the device 180 to communicate with the data storage device 102. The device 180 may operate in compliance with a JEDEC Solid State Technology Association industry specification, such as an embedded MultiMedia Card (eMMC) specification or a Universal Flash Storage (UFS) Host Controller Interface specification. The device 180 may operate in compliance with one or more other specifications, such as a Secure Digital (SD) Host Controller specification as an illustrative example. Alternatively, the device 180 may communicate with the data storage device 102 in accordance with another communication protocol. In some implementations, the system 100, the data storage device 102, or the memory 104 may be integrated within a network-accessible data storage system, such as an enterprise data system, an NAS system, or a cloud data storage system, as illustrative examples.

In some implementations, the data storage device 102 may include a solid state drive (SSD). The data storage device 102 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, the data storage device 102 may be coupled to the device 180 via a network. For example, the network may include a data center storage system network, an enterprise storage system network, a storage area network, a cloud storage network, a local area network (LAN), a wide area network (WAN), the Internet, and/or another network.

To further illustrate, the data storage device 102 may be configured to be coupled to the device 180 as embedded memory, such as in connection with an embedded Multi-Media Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), another type of memory, or a combination thereof. In a particular embodiment, the data storage device 102 is indirectly coupled to an accessing device (e.g., the device 180) via a network. For example, the data storage device 102 may be a network-attached storage (NAS) device or a component (e.g., a solid-state drive (SSD) component) of a data center storage system, an enterprise storage system, or a storage area network. The memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. An apparatus comprising:
a group of storage elements including a first storage element and a second storage element;
a first bit line coupled to the first storage element;
a second bit line coupled to the second storage element;
a first bit line charging circuit coupled to the first bit line, the first bit line charging circuit configured to charge the first bit line to a first bias voltage of multiple bias voltages based on a first programming state;
a second bit line charging circuit coupled to the second bit line, the second bit line charging circuit configured to charge the second bit line to a second bias voltage of the multiple bias voltages based on a second programming state, the second programming state different than the first programming state;
a supply node; and
a supply transistor coupled to the supply node and configured to receive multiple supply voltages from the supply node.

2. The apparatus of claim 1, wherein the multiple bias voltages enable programming of the group of storage elements based on a single programming pulse applied to the group of storage elements during a write operation.

3. The apparatus of claim 2, wherein the multiple bias voltages enable the first bit line to be biased independently of the second bit line such that the single programming pulse programs the first programming state to the first storage element and the second programming state to the second storage element.

4. The apparatus of claim 1, further comprising:
a driver circuit; and
a transistor coupled to the driver circuit and to the supply transistor.

5. The apparatus of claim 4, wherein the driver circuit is configured to apply multiple voltages to a gate terminal of the transistor.

6. The apparatus of claim 5, wherein the bias voltages are based on the multiple voltages, the multiple supply voltages, and a threshold voltage of the transistor.

7. The apparatus of claim 5, wherein the driver circuit is configured to increase a voltage applied to the gate terminal in steps to generate the multiple voltages.

8. An apparatus comprising:
means for storing a value;
means for charging a bit line coupled to the means for storing; and
means for increasing a voltage in voltage steps that correspond to multiple voltages and for applying one of multiple voltages to a gate of the means for charging to charge the bit line to one of multiple bit line voltages to enable programming of the means for storing using a single programming pulse, the multiple voltages corresponding to a set of programming states.

9. The apparatus of claim 8, further comprising means for coupling a supply node to the means for charging.

10. The apparatus of claim 8, wherein the means for increasing the voltage includes one or more amplifiers configured to generate the multiple voltages.

11. The apparatus of claim 8, further comprising means for counting coupled to the means for increasing the voltage, wherein the means for counting is configured to store a value indicating a cycle of a bit line charging process.

12. The apparatus of claim 11, wherein the means for increasing the voltage is further configured to select one of the multiple voltages based on the value stored by the means for counting.

13. A system comprising:
a controller; and
at least one memory die coupled to the controller, the at least one memory die comprising:
a group of storage elements comprising a first storage element;
a group of bit lines coupled to the group of storage elements, the group of bit lines comprising a first bit line coupled to the first storage element;
a group of bit line charging circuits coupled to the group of storage elements and to the group of bit lines, the group of bit line charging circuits comprising a first bit line charging circuit coupled to the first bit line;
a counter configured to store a counter value associated with a cycle of a bit line charging process to charge the group of bit lines;
a set of latches configured to receive data from the controller, the data indicating a programming state for the first storage element; and
a comparison circuit coupled to the counter and to the set of latches, the comparison circuit configured to decouple the first bit line from a supply voltage in response to the counter value indicating a cycle of the bit line charging process that corresponds corresponding to the programming state.

14. The system of claim 13, wherein the comparison circuit is further configured to enable charging of the first bit line during the bit line charging process in response to the counter value differing from the programming state.

15. The system of claim 13, wherein the first bit line charging circuit includes a supply node configured to provide the supply voltage to the first bit line and further includes a transistor coupled to the supply node.

16. The system of claim 15, wherein the comparison circuit is further configured to deactivate the transistor in response to the counter value corresponding to the programming state.

* * * * *